US012790687B2

(12) United States Patent
Suzaki

(10) Patent No.: US 12,790,687 B2
(45) Date of Patent: Nov. 10, 2026

(54) SUBSTRATE PROCESSING APPARATUS, LIQUID SOURCE REPLENISHMENT SYSTEM, SUBSTRATE PROCESSING METHOD, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventor: Kenichi Suzaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 727 days.

(21) Appl. No.: 18/337,911

(22) Filed: Jun. 20, 2023

(65) Prior Publication Data

US 2023/0332287 A1 Oct. 19, 2023

Related U.S. Application Data

(63) Continuation of application No. PCT/JP2020/048857, filed on Dec. 25, 2020.

(51) Int. Cl.
*C23C 16/448* (2006.01)
*C23C 16/455* (2006.01)
(Continued)

(52) U.S. Cl.
CPC .... *C23C 16/4482* (2013.01); *C23C 16/45561* (2013.01); *C23C 16/52* (2013.01); *H10P 14/60* (2026.01)

(58) Field of Classification Search
CPC ..... C23C 16/34; C23C 16/40; C23C 16/4412; C23C 16/448–4482; C23C 16/45544;
(Continued)

(56) References Cited

U.S. PATENT DOCUMENTS 10,480,069 B2 * 11/2019 Kitagawa ................ C23C 14/12
2016/0002789 A1 * 1/2016 Kontani ................ C23C 14/246
118/704
(Continued)

FOREIGN PATENT DOCUMENTS

JP 2001-044389 A 2/2001
JP 2004-111787 A 4/2004
(Continued)

OTHER PUBLICATIONS

Examination Report with English translation in Taiwan Application No. 110139469, dated Jun. 2, 2022, 19 pages.

*Primary Examiner* — Benjamin Kendall
(74) *Attorney, Agent, or Firm* — Edell, Shapiro & Finann, LLC

(57) ABSTRACT

A substrate processing apparatus includes: a vaporization vessel; a liquid source replenishment line whose first end is connected to the vaporization vessel and whose second end is connected to a supply source of a liquid source; a first valve provided at the replenishment line; a second valve provided at the replenishment line and upstream of the first valve; a liquid source storage provided between the first valve and the second valve; and a controller for controlling opening and closing operations of the first valve and the second valve to supply the liquid source into the vaporization vessel by performing: (a) filling the liquid source storage with the liquid source by opening the second valve while the first valve is closed; and (b) closing the second valve after (a) and discharging the liquid source into the vaporization vessel by opening the first valve.

18 Claims, 9 Drawing Sheets

(51) Int. Cl.
*C23C 16/52* (2006.01)
*H10P 14/60* (2026.01)

(58) Field of Classification Search
CPC ... C23C 16/45561; C23C 16/52; H10P 14/60; H10P 72/0402
See application file for complete search history.

(56) References Cited

U.S. PATENT DOCUMENTS

| | | | | |
|---|---|---|---|---|
| 2019/0211449 | A1* | 7/2019 | Isobe .................... | C23C 16/403 |
| 2020/0406209 | A1 | 12/2020 | Matsumoto et al. | |
| 2023/0257878 | A1* | 8/2023 | Chandrasekharan ... | C23C 16/26<br>427/248.1 |

FOREIGN PATENT DOCUMENTS

| | | | |
|---|---|---|---|
| JP | 2013-222768 | A | 10/2013 |
| JP | WO2018/056346 | A1 | 3/2018 |
| TW | 202015845 | A | 5/2020 |
| WO | 2018/110649 | A1 | 6/2018 |

* cited by examiner

SUBSTRATE PROCESSING APPARATUS, LIQUID SOURCE REPLENISHMENT SYSTEM, SUBSTRATE PROCESSING METHOD, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a bypass continuation application of PCT International Application No. PCT/JP2020/048857, filed on Dec. 25, 2020, in the WIPO, the entire contents of which are hereby incorporated by reference.

TECHNICAL FIELD

The present disclosure relates to a substrate processing apparatus, a liquid source replenishment system, a substrate processing method, a method of manufacturing a semiconductor device and a non-transitory computer-readable recording medium.

BACKGROUND

According to some related arts, a liquid source replenishment system may be used to replenish a vaporization vessel of a substrate processing apparatus with a liquid source.

However, when replenishing the vaporization vessel with the liquid source supplied (or pressure-fed) from a supply system, it may be difficult to accurately control a supply amount of the liquid source supplied into the vaporization vessel.

SUMMARY

According to the present disclosure, there is provided a technique capable of controlling a supply amount of a liquid source so as to accurately supply a predetermined amount of the liquid source into a vaporization vessel when replenishing the vaporization vessel with the liquid source.

According to one aspect of the technique of the present disclosure, there is provided a substrate processing apparatus including: a vaporization vessel; a liquid source replenishment line whose first end is connected to the vaporization vessel and whose second end is connected to a supply source of a liquid source; a first valve provided at the liquid source replenishment line; a second valve provided at the liquid source replenishment line and upstream of the first valve; a liquid source storage provided between the first valve and the second valve; and a controller configured to be capable of controlling opening and closing operations of the first valve and the second valve so as to supply the liquid source into the vaporization vessel by performing a filling and discharging process including: (a) filling the liquid source storage with the liquid source by opening the second valve while the first valve is closed; and (b) closing the second valve after (a) and discharging the liquid source filled in the liquid source storage into the vaporization vessel by opening the first valve.

DETAILED DESCRIPTION

Figure 1:
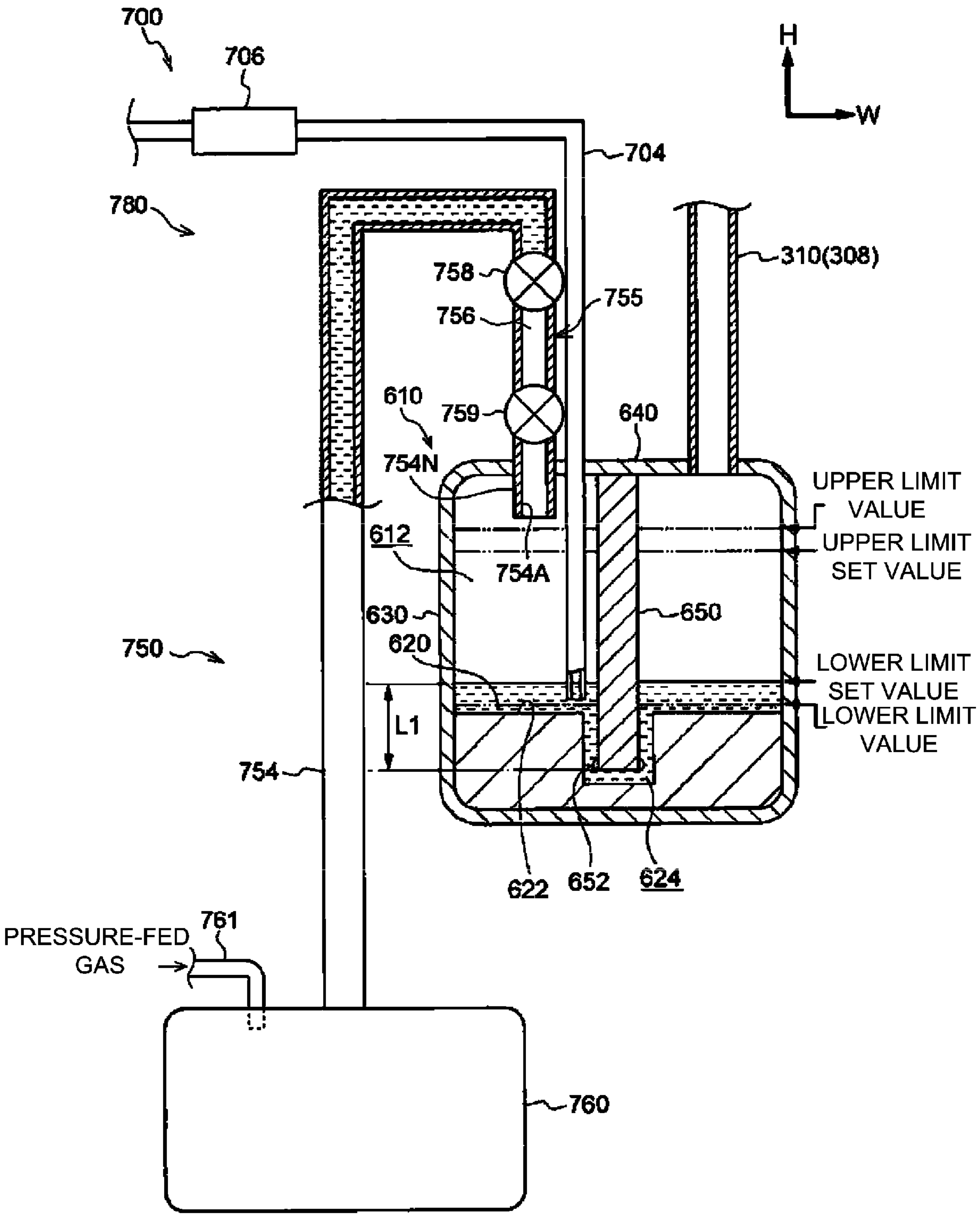
FIG. 1 is a diagram schematically illustrating a configuration of a storage tank and its periphery provided in a substrate processing apparatus according to one or more embodiments of the present disclosure.

The discloser of the present disclosure et al. have conducted an intensive research on a relationship between an amount of a liquid source stored in a storage tank and a uniformity of a film (which is formed on a substrate by supplying a source gas generated by vaporizing the liquid source) on a surface of the substrate. As a result, the discloser of the present disclosure et al. have found that, a concentration of impurities contained in the source gas (which is vaporized) may change (vary) according to the amount (remaining amount) of the liquid source stored in the storage tank, and that, when the amount of the liquid source stored in the storage tank is reduced, the uniformity of the film (which is formed on the substrate) on the surface of the substrate may be improved.

Therefore, it is preferable to reduce the amount of the liquid source stored in the storage tank, and for this purpose, it is preferable to replenish the storage tank with a small amount of the liquid source with a high accuracy. For that reason, it is conceivable to control a replenishment amount of the liquid source by using a liquid mass flow controller. However, in order to apply the liquid mass flow controller to accurately control the replenishment amount, a differential pressure between a replenishment source and a replenishment destination should be stable, and it is difficult to apply the liquid mass flow controller when replenishing a storage tank whose inner pressure changes during a replenishment operation.

Embodiments of Present Disclosure

Hereinafter, one or more embodiments (also simply referred to as "embodiments") according to the technique of the present disclosure will be described.

<Overall Configuration>

Hereinafter, examples of a substrate processing apparatus, a liquid source replenishment system, a substrate processing method, a method of manufacturing a semiconductor device and a non-transitory computer-readable recording medium according to the embodiments of the present disclosure will be described with reference to FIGS. 1 through 5. In the drawings, a direction indicated by an arrow H represents a up-and-down direction (that is, a vertical direction) of a substrate processing apparatus 10, a direction indicated by an arrow W represents a width direction (that is, a horizontal direction) of the substrate processing apparatus 10, and a direction indicated by an arrow D represents a depth direction (that is, another horizontal direction) of the substrate processing apparatus 10. Hereinafter, the up-and-down direction of the substrate processing apparatus 10 may also be simply referred to as an "apparatus up-and-down direction", the width direction of the substrate processing apparatus 10 may also be simply referred to as an "apparatus width direction", the depth direction of the substrate processing apparatus 10 may also be simply referred to as an "apparatus depth direction". In the present specification, the drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

Figure 3:
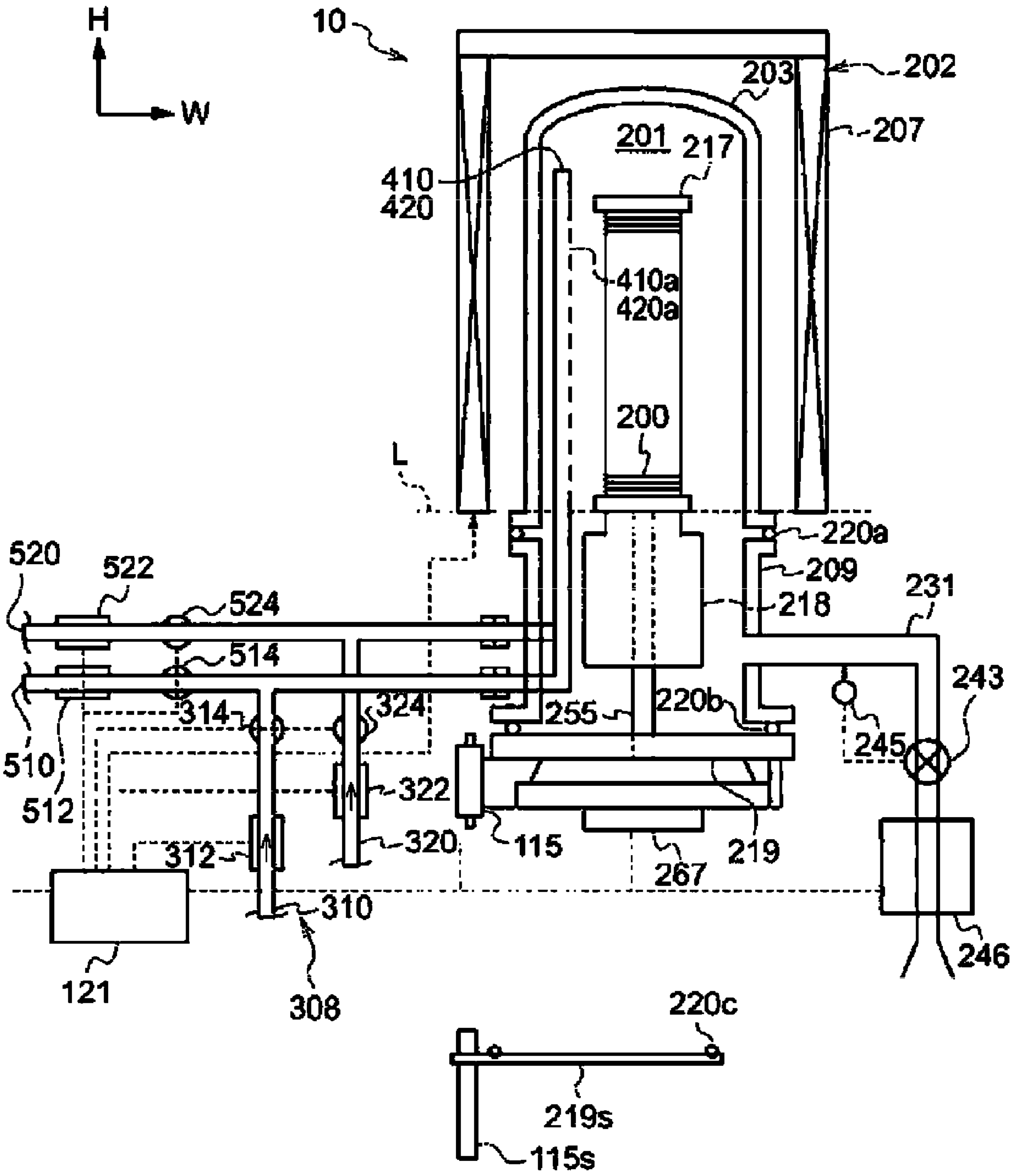
FIG. 3 is a diagram schematically illustrating the substrate processing apparatus according to the embodiments of the present disclosure.

As shown in FIG. 3, the substrate processing apparatus 10 is provided with a liquid source replenishment system 780 (see FIG. 1). Further, the substrate processing apparatus 10 is provided with a process furnace 202 in which a wafer 200 serving as a substrate is processed. The process furnace 202 includes a heater 207 extending in the apparatus up-and-down direction. The heater 207 is of a cylindrical shape, and is supported by a heater base (not shown) serving as a support plate. The heater 207 is configured to heat an inside of a process chamber 201 described later to a predetermined temperature.

Figure 2:
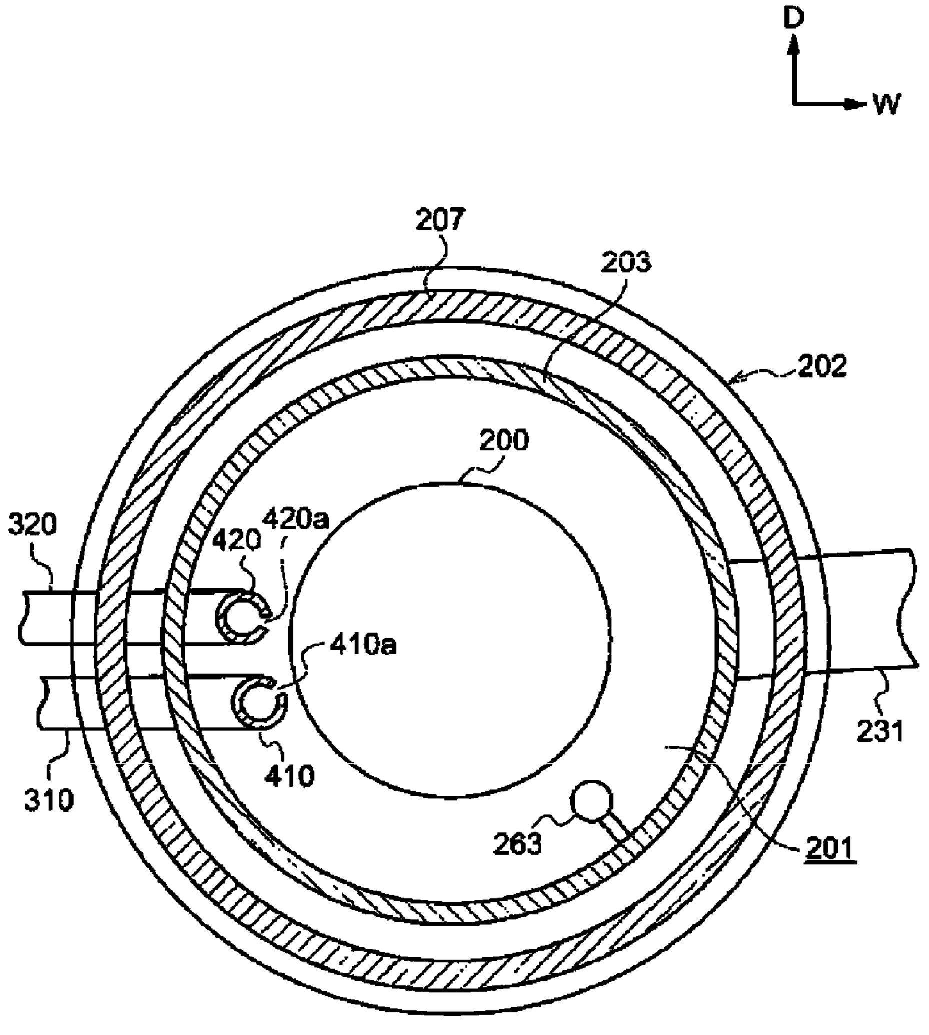
FIG. 2 is a diagram schematically illustrating a cross-section of a process chamber and its periphery provided in the substrate processing apparatus according to the embodiments of the present disclosure.

Further, as shown in FIGS. 2 and 3, a process tube 203 serving as a process structure is provided on an inner side of the heater 207 in a manner concentric with the heater 207. The process tube 203 is of a cylindrical shape. The process chamber 201 in which a plurality of wafers including the wafer 200 is processed is provided in an inner side of the process tube 203. Hereinafter, the plurality of wafers including the wafer 200 may also be referred to as "wafers 200". Specifically, the wafers 200 (for example, 25 to 200 wafers) are stacked in the vertical direction by a boat 217 serving as a substrate support (or a substrate retainer), and the wafers 200 stacked by the boat 217 are arranged in the process chamber 201. A heat insulating cylinder 218 of a cylindrical shape is arranged under the boat 217. With such a configuration, it is possible to suppress a transmission of a heat from the heater 207 to a seal cap 219 described later.

In addition, as shown in FIG. 3, a manifold (inlet flange) 209 of a cylindrical shape is arranged below the process tube 203 in a manner concentric with the process tube 203. An upper end of the manifold 209 faces a lower end of the process tube 203, and the manifold 209 supports the process tube 203 via an O-ring 220*a* serving as a seal.

In the process chamber 201, nozzles 410 and 420 extending in the vertical direction are arranged between a wall surface of the process tube 203 and wafers 200 stacked by the boat 217. Further, a plurality of supply holes 410*a* and a plurality of supply holes 420*a* are provided in the nozzles 410 and 420, respectively, in regions facing the wafers 200 in the horizontal direction. It is possible to supply a gas through the supply holes 410*a* or the supply holes 420*a*. As a result, it is possible to supply the gas (which is ejected from the supply holes 410*a* or the supply holes 420*a*) toward the wafers 200.

Furthermore, a lower end portion of each of the nozzles 410 and 420 is bent to pass through a side wall of the manifold 209 such that the lower end portion of each of the nozzles 410 and 420 protrudes outward from the manifold 209. Gas supply pipes 310 and 320 serving as gas supply lines are connected to the lower ends of the nozzles 410 and 420, respectively. Thereby, it is possible to supply a plurality of kinds of gases to the process chamber 201.

Mass flow controllers (MFCs) 312 and 322 serving as flow rate controllers (flow rate control structures) and valves 314 and 324 serving as opening/closing valves are sequentially installed at the gas supply pipes 310 and 320 in this order from upstream sides to downstream sides of the gas supply pipes 310 and 320 in a flow direction of the gas flowing through the gas supply pipes 310 and 320 (hereinafter, also simply referred to as a "gas flow direction"), respectively. In addition, gas supply pipes 510 and 520 serving as gas supply lines are connected to the gas supply pipes 310 and 320 at downstream sides of the valves 314 and 324 in the gas flow direction, respectively. The gas supply pipes 510 and 520 are configured such that an inert gas is supplied through the gas supply pipes 510 and 520. MFCs 512 and 522 serving as flow rate controllers (flow rate control structures) and valves 514 and 524 serving as opening/closing valves are sequentially installed at the gas supply pipes 510 and 520 in this order from upstream sides to downstream sides of the gas supply pipes 510 and 520 in the gas flow direction, respectively.

The source gas serving as one of process gases is supplied into the process chamber 201 through the gas supply pipe 310 provided with the MFC 312 and the valve 314 and the nozzle 410. That is, a supplier 308 (which is a supply structure or a supply system) through which a gas such as the source gas is supplied into the process chamber 201 may include the gas supply pipe 310, the MFC 312, the valve 314 and the nozzle 410.

A source gas supplier (which is a source gas supply structure or a source gas supply system) is constituted mainly by the gas supply pipe 310, the MFC 312 and the valve 314. The source gas supplier may further include the nozzle 410. The source gas supplier may also be referred to as a source supplier (which is a source supply structure or a source supply system).

On the other hand, a reactive gas serving as one of the process gases is supplied into the process chamber 201 through the gas supply pipe 320 provided with the MFC 322 and the valve 324 and the nozzle 420. Hereinafter, the source gas and the reactive gas may be collectively or individually referred to as a "process gas".

In a case where the reactive gas (reactant) is supplied through the gas supply pipe 320, a reactive gas supplier (which is a reactive gas supply structure or a reactive gas supply system) is constituted mainly by the gas supply pipe 320, the MFC 322 and the valve 324. The reactive gas supplier may also be referred to as a reactant supplier (which is a reactant supply structure or a reactant supply system). The reactive gas supplier may further include the nozzle 420. In a case where the reactive gas is supplied through the nozzle 420, the nozzle 420 may also be referred to as a "reactive gas nozzle".

In addition, the inert gas is supplied into the process chamber 201 through the gas supply pipes 510 and 520 provided with the MFCs 512 and 522 and the valves 514 and 524, respectively, and the nozzles 410 and 420.

An inert gas supplier (which is an inert gas supply structure or an inert gas supply system) is constituted mainly by the gas supply pipes 510 and 520, the MFCs 512 and 522 and the valves 514 and 524.

For example, a first end of an exhaust pipe 231 (which serves as an exhaust flow path through which an inner atmosphere of the process chamber 201 is exhausted) is connected to a wall surface of the manifold 209. A pressure sensor 245 serving as a pressure detector (which is a pressure detecting structure) configured to detect an inner pressure of the process chamber 201 and an APC (Automatic Pressure Controller) valve 243 serving as an exhaust valve (which is a pressure regulator) are connected to the exhaust pipe 231. Further, a vacuum pump 246 serving as a vacuum exhaust apparatus is connected to a second end of the exhaust pipe 231.

With the vacuum pump 246 in operation, the APC valve 243 may be opened or closed to perform a vacuum exhaust of the process chamber 201 or stop the vacuum exhaust of the process chamber 201. Further, with the vacuum pump 246 in operation, an opening degree of the APC valve 243 may be adjusted based on pressure information detected by the pressure sensor 245 in order to adjust the inner pressure of the process chamber 201. An exhauster (which is an exhaust structure or an exhaust system) is constituted mainly by the exhaust pipe 231, the APC valve 243 and the pressure sensor 245. The exhauster may further include the vacuum pump 246.

The seal cap 219 serving as a furnace opening lid capable of airtightly sealing (or closing) a lower end opening of the manifold 209 is provided under the manifold 209. The seal cap 219 is in contact with a lower end of the manifold 209 from thereunder. An O-ring **220*b* serving as a seal is provided on an upper surface of the seal cap 219 so as to be in contact with the lower end of the manifold 209. A rotator (which is a rotating structure) 267 configured to rotate the boat 217 is provided at the seal cap 219 in a manner opposite to the process chamber 201. A rotating shaft 255 of the rotator 267 is connected to the boat 217 through the seal cap 219. As the rotator 267 rotates the boat 217, the wafers 200 accommodated in the boat 217** are rotated.

The seal cap 219 can be elevated or lowered in the vertical direction by a boat elevator 115 serving as an elevating structure vertically provided outside the process tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) capable of transferring (loading) the boat 217 and the wafers 200 accommodated in the boat 217 into the process chamber 201 and capable of transferring (unloading) the boat 217 and the wafers 200 accommodated in the boat 217 out of the process chamber 201. A shutter **219*s* serving as a furnace opening lid capable of airtightly sealing (or closing) the lower end opening of the manifold 209 is provided under the manifold 209. The shutter 219*s* is configured to close the lower end opening of the manifold 209 when the seal cap 219 is lowered by the boat elevator 115. An O-ring 220*c* serving as a seal is provided on an upper surface of the shutter 219*s* so as to be in contact with the lower end of the manifold 209. An opening and closing operation of the shutter 219*s* such as an elevation operation and a rotation operation is controlled by a shutter opener/closer (which is a shutter opening/closing structure) 115*s***.

As shown in FIG. 2, a temperature sensor 263 serving as a temperature detector is installed in the process tube 201. A state of electric conduction to the heater 207 is adjusted based on temperature information detected by the temperature sensor 263 such that a desired temperature distribution of an inner temperature of the process chamber 201 can be obtained. Similar to the nozzles 410 and 420, the temperature sensor 263 is provided along an inner wall of the process tube 203.

Figure 4:
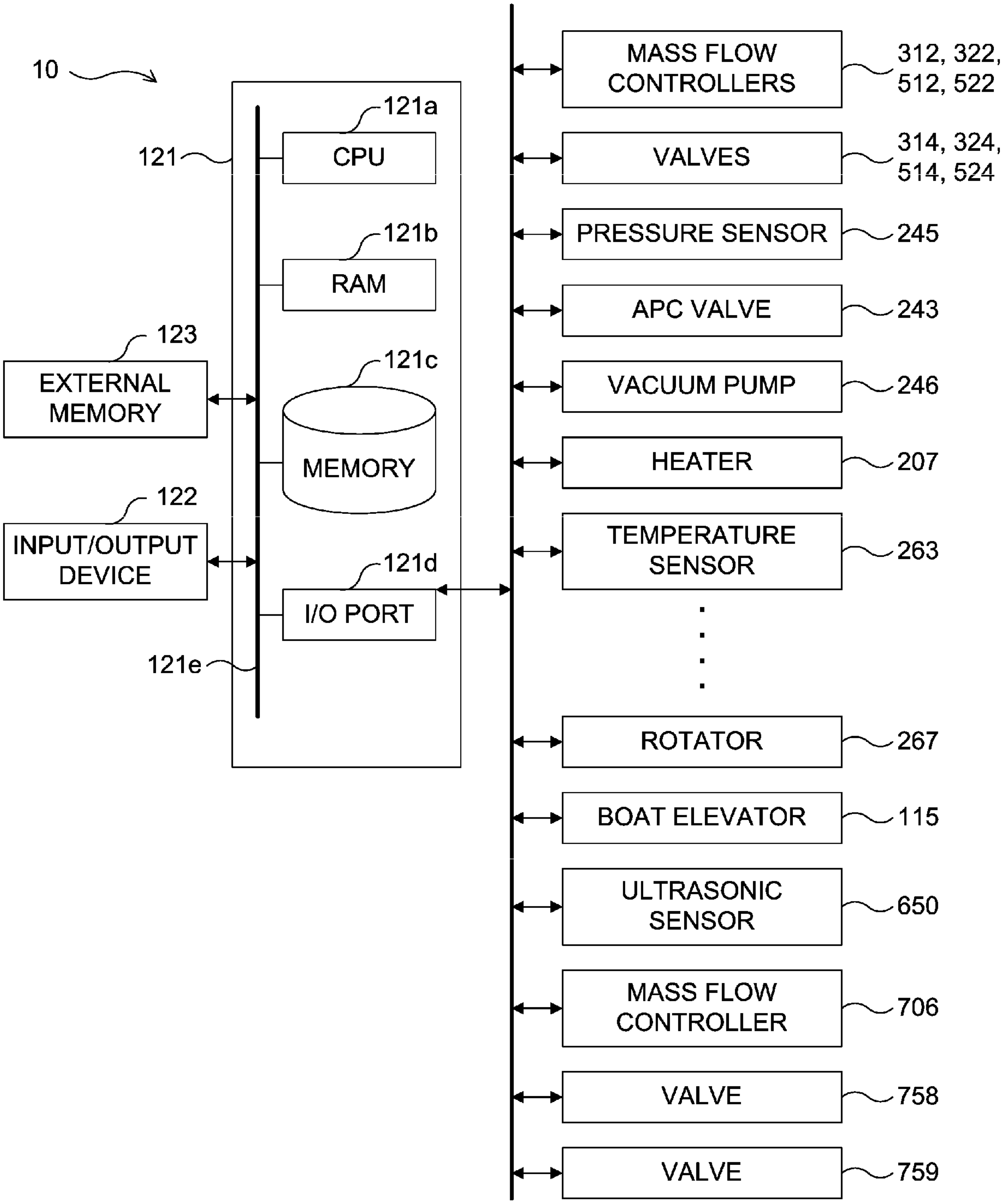
FIG. 4 is a block diagram schematically illustrating a controller and related components provided in the substrate processing apparatus according to the embodiments of the present disclosure.

Subsequently, a controller 121 serving as a control structure provided in the substrate processing apparatus 10 will be described. As shown in FIG. 4, the controller 121 is constituted by a computer including a CPU (Central Processing Unit) **121*a*, a RAM (Random Access Memory) 121*b*, a memory 121*c* and an I/O port (input/output port) 121*d*. The RAM 121*b*, the memory 121*c* and the I/O port 121*d* may exchange data with the CPU 121*a* through an internal bus 121*e*. For example, an input/output device 122 constituted by a component such as a touch panel is connected to the controller 121**.

The memory **121*c* is configured by a component such as a flash memory and a hard disk drive (HDD). For example, a control program configured to control an operation of the substrate processing apparatus 10, a liquid source replenishment program described later and data for performing each may be readably stored in the memory 121*c***.

The RAM **121*b* functions as a memory area (work area) where a program or data read by the CPU 121*a*** is temporarily stored.

The I/O port **121*d* is connected to the components described above such as the MFCs 512, 522, 312 and 322, the valves 514, 524, 314 and 324, the pressure sensor 245, the APC valve 243, the vacuum pump 246, the temperature sensor 263, the heater 207, the rotator 267, the boat elevator 115, the shutter opener/closer 115*s* and components described later such as an ultrasonic sensor 650, an MFC 706 and valves 758 and 759**.

The CPU **121*a* is configured to read the control program from the memory 121*c* and execute the read control program. In addition, the CPU 121*a* is configured to read the data from the memory 121*c*, for example, in accordance with an operation command inputted from the input/output device 122**.

In accordance with the contents of the read data, the CPU **121*a* may be configured to be capable of controlling various operations such as flow rate adjusting operations for various gases by the MFCs 512, 522, 312 and 322, opening and closing operations of the valves 514, 524, 314 and 324, an opening and closing operation of the APC valve 243, a pressure regulating operation (pressure adjusting operation) by the APC valve 243 based on the pressure sensor 245, a start and stop operation of the vacuum pump 246, a temperature adjusting operation by the heater 207 based on the temperature sensor 263, an operation of adjusting a rotation and a rotation speed of the boat 217 by the rotator 267, an elevating and lowering operation of the boat 217 by the boat elevator 115 and an opening and closing operation of the shutter 219***s* by the shutter opener/closer 115*s*. In addition, the CPU 121*a* may be configured to be capable of controlling an opening and closing operation of the valve 758 serving as a second valve and an opening and closing operation of the valve 759 serving as a first valve along with an execution of the liquid source replenishment program (that is, a liquid source replenishment process). The controller 121 may be further configured as a control structure capable of controlling the opening and closing operations of the valves 758 and 759 of a liquid source replenishment system described later. Alternatively, another controller different from the controller 121 may be provided so as to control the ultrasonic sensor 650, the MFC 706 and the valves 758 and 759.

The controller 121 may be embodied by installing the program stored in an external memory 123 into the computer. For example, the external memory 123 may include a magnetic tape, a magnetic disk such as a flexible disk and a hard disk drive, an optical disk such as a CD and a DVD, a magneto-optical disk such as an MO and a semiconductor memory such as a USB memory and a memory card.

The memory 121*c* or the external memory 123 may be embodied by a non-transitory computer readable recording medium. Hereafter, the memory 121*c* and the external memory 123 may be collectively or individually referred to as a recording medium. Thus, in the present specification, the term "recording medium" may refer to the memory 121*c* alone, may refer to the external memory 123 alone or may refer to both of the memory 121*c* and the external memory 123. Instead of the external memory 123, a communication structure such as the Internet and a dedicated line may be used for providing the program to the computer.

Further, a control of the ultrasonic sensor 650, the MFC 706 and the valves 758 and 759 by the controller 121 will be described later together with operations thereof.

<Configuration of Main Components>

<Storage Tank>

Subsequently, a storage tank 610 in which the liquid source is stored will be described. The source gas is obtained by vaporizing the liquid source. That is, the liquid source is vaporized in the storage tank 610 serving as a vaporization vessel.

For example, the storage tank 610 is of a rectangular parallelepiped shape or of a cylindrical shape. Further, as shown in FIG. 1, a storage space 612 provided in the storage tank 610 is defined by a bottom structure 620, a wall structure 630 extending upward from a peripheral edge of the bottom structure 620 and a ceiling structure 640 configured to close the storage space 612 surrounded by the wall structure 630 from thereabove. The storage space 612 is a space airtightly (hermetically) sealed from an outside thereof. In addition, an inner pressure of the storage space 612 is set to a predetermined pressure. For example, a lower end portion of the gas supply pipe 310 described above is disposed in the storage space 612 through the ceiling structure 640.

The bottom structure 620 is provided with a bottom surface 622 facing upward. A recess (which is a concave structure) 624 in which a part of the bottom surface 622 is recessed is provided in a central portion of the bottom surface 622 in the apparatus width direction and the apparatus depth direction. The recess 624 extends in the vertical direction, and a cross-section of the recess 624 is of a rectangular shape.

For example, a lower limit set value for the liquid source in the present embodiments is set to be higher (larger) than a lower limit value at which the liquid source can be stored in the storage space 612 (see FIG. 1). For example, an upper limit set value for the liquid source in the present embodiments is set to be lower (smaller) than an upper limit value at which the liquid source can be stored in the storage space 612 (see FIG. 1).

<Ultrasonic Sensor>

The ultrasonic sensor 650 serving as a liquid surface level sensor is provided in the storage space 612 to extend in the vertical direction, and an upper end of the ultrasonic sensor 650 is attached to the ceiling structure 640. A cross-section of the ultrasonic sensor 650 is of a rectangular shape that is smaller than the cross-section of the recess 624. Further, a lower portion of the ultrasonic sensor 650 is provided in the recess 624. A sensor element 652 is provided at a lower end of the ultrasonic sensor 650.

In such a configuration, an ultrasonic wave generated by the sensor element 652 is reflected on a liquid surface of the liquid source. A wave receiver (which is a waver receiving structure) (not shown) of the ultrasonic sensor 650 receives the wave reflected on the liquid surface. Thereby, the ultrasonic sensor 650 is configured to be capable of continuously detecting a liquid surface level of the liquid source stored in the storage tank 610. In a manner described above, the ultrasonic sensor 650 functions as a continuous sensor (also referred to as a "continuous type sensor", a "continuous type level sensor", or a "continuous liquid surface level sensor").

<Vaporizer>

A vaporizer (which is a vaporizing structure) 700 is an apparatus configured to vaporize the liquid source stored in the storage tank 610 into the source gas by using a bubbling method. The vaporizer 700 may include a gas supply pipe 704 through which a carrier gas is supplied and a mass flow controller (MFC) 706.

The gas supply pipe 704 extends through the ceiling structure 640. A first end of the gas supply pipe 704 is disposed in the liquid source stored in the storage tank 610. In addition, the MFC 706 is provided at the gas supply pipe 704 and outside the storage tank 610.

In such a configuration, the carrier gas whose flow rate is adjusted by the MFC 706 is supplied to the liquid source (stored in the storage tank 610) through the first end of the gas supply pipe 704. Then, the carrier gas acts on the liquid source such that the liquid source is vaporized. The source gas obtained by vaporizing the liquid source is supplied (pressure-fed) to the gas supply pipe 310 by an inner pressure (P0) of the storage tank 610.

In the bubbling method described above, it is possible to control a supply amount of the carrier gas supplied to the storage tank 610 (which is a bubbler). However, an actual vaporization amount of the liquid source cannot be grasped. Therefore, according to the present embodiments, a vaporization amount (actual vaporization amount) is found by detecting a decrease amount of the liquid source using the ultrasonic sensor 650 described above.

<Replenishment Structure>

A replenishment structure 750 serving as a liquid source replenishment system is an apparatus configured to replenish the liquid source (which is supplied or pressure-fed from a replenishment tank 760) to the storage tank 610. The replenishment structure 750 may include: a liquid supply pipe 754 serving as a liquid source replenishment line through which the liquid source is supplied; the valve (which is an opening/closing valve) 759 serving as the first valve; and the valve (which is an opening/closing valve) 758 serving as the second valve. The replenishment structure 750 may further include the replenishment tank 760 serving as a supply source of the liquid source.

The liquid supply pipe 754 passes through the ceiling structure 640, and a nozzle 754N serving as a liquid source supply nozzle is provided at a first end of the liquid supply pipe 754. That is, an upstream end of the nozzle 754N is connected to the liquid supply pipe 754. The nozzle 754N is arranged in the storage space 612, and a discharge port 754A is arranged above a liquid surface of the liquid source stored in the storage tank 610 (that is, above the upper limit value of the storage, see FIG. 1). By arranging the discharge port 754A above the liquid surface of the liquid source in a manner described above, it is possible to discharge (or eject) the liquid source from the liquid supply pipe 754 to the storage space 612. That is, in a filling and discharging process described later, it is possible to discharge by opening the valve 759 the liquid source from a liquid source storage 756 to the storage space 612 due to a pressure difference between the liquid source storage 756 and the storage space 612.

A downstream end portion 755 arranged such that an axial direction thereof is the vertical direction is provided at the liquid supply pipe 754 at a portion that extends from the nozzle 754N. The valves 758 and 759 are provided at the downstream end portion 755. The valves 758 and 759 are provided at the liquid supply pipe 754 and outside the storage tank 610. The valves 758 and 759 are provided above the storage tank 610 in the vertical direction. Further, the valve 758 is provided upstream (on an upper side) of the valve 759 and away from the valve 759, and the liquid source storage 756 serving as a space in which the liquid source is stored is defined by a portion of the liquid supply pipe 754 between the valves 758 and 759. The liquid source storage 756 is provided above the storage tank 610 in the vertical direction.

While the present embodiments are described by way of an example in which the downstream end portion 755 is provided in the in the vertical direction, the downstream end portion 755 may be arranged in an inclined manner such that its part adjacent to the nozzle 754N faces downward. Further, while the present embodiments are described by way of an example in which both of the valves 758 and 759 are provided at the downstream end portion 755, the valve 758 may be provided upstream of the downstream end portion 755. However, by arranging the valves 758 and 759 side by side in the vertical direction as in the present embodiments, it is possible to properly discharge (eject) the liquid source stored between the valves 758 and 759 by using the gravity.

The replenishment tank 760 is arranged outside the storage tank 610, and is connected to a second end of the liquid supply pipe 754. A pressure-feeding pipe (pumping pipe) 761 is connected to an upper end of the replenishment tank 760. A pressure-fed gas is supplied from the pressure-feeding pipe 761 to the replenishment tank 760, and the liquid source stored in the replenishment tank 760 is pressure-fed (or delivered) into the liquid supply pipe 754 by a pressure-feeding pressure (also referred to as a "delivery pressure") P1 in the replenishment tank 760.

For example, the pressure-feeding pressure P1 in the replenishment tank 760 is higher than the inner pressure P0 of the storage tank 610, preferably ten times or more of the pressure P0. By setting the pressure-feeding pressure P1 to ten times or more of the pressure P0, it is possible to fill the liquid source storage 756 with a sufficient amount of the liquid source. In a case where the pressure-feeding pressure P1 is less than ten times of the pressure P0, it may not be possible to fill the liquid source storage 756 with the sufficient amount of the liquid source due to an atmosphere of the pressure P0 present in the liquid source storage 756 prior to filling the liquid source storage 756 with the liquid source. For example, in order to fill the liquid source storage 756 with as much the liquid source as possible, it is preferable that the pressure difference is as large as possible. However, it is preferable to also consider parameters such as an upper limit of a pressure resistance of the piping (or the valves on the piping).

For example, the inner pressure P0 of the storage tank 610 is set to be within a range from 100 Pa to 10,000 Pa, and the pressure-feeding pressure P1 from the replenishment tank 760 is set to be within a range from 0.1 MPa to 10 MPa.

When replenishing the storage tank 610 with the liquid source from the replenishment tank 760 via the liquid supply pipe 754, the liquid source storage 756 is filled with the liquid source by opening the valve 758 while the valve 759 is closed. Thereafter, by closing the valve 758 and opening the valve 759, the liquid source is discharged (ejected) from the liquid source storage 756 to the storage tank 610. That is, the liquid source is temporarily stored in the liquid source storage 756, and the liquid source stored in the liquid source storage 756 is discharged to the storage tank 610 to replenish the liquid source (filling and discharging process). In addition, the valves 758 and 759 are closed when the liquid source is not replenished.

In a case where a capacity (or volume) of the liquid source storage 756 is represented by a capacity X0, an amount of the liquid source filled in the liquid source storage 756 is represented by a fillable amount X1 and an amount of the liquid source discharged from the liquid source storage 756 by opening the valve 759 is represented by a discharge amount X2, it satisfies a relationship of $X0 \geq X1 \geq X2$ (that is, X0 is equal to or greater than X1, and X1 is equal to or greater than X2). The liquid source is vaporized in the storage tank 610. When the valve 759 is opened, a gaseous substance is introduced into the liquid source storage 756. When the valve 759 is closed and the valve 758 is opened in such a state, the gaseous substance is compressed by the liquid source pressure-fed from the liquid supply pipe 754 and pushed into the liquid source storage 756. Thus, when the gaseous substance is introduced into the liquid source storage 756, X0 is greater than X1 (that is, $X0 > X1$). In addition, when an entire amount of the liquid source filled in the liquid source storage 756 is not discharged, X1 is greater than X2 (that is, $X1 > X2$). By setting the inner pressure of the storage tank 610 to a decompressed state (reduced-pressure state), it is possible to minimize an amount of the gaseous substance entering the liquid source storage 756 when the valve 759 is opened. In the present embodiments, the decompressed state may refer to a pressure lower than an atmospheric pressure. Preferably, the decompressed state may refer to the pressure P0.

For example, the capacity X0 is 20 cc or less, preferably 10 cc or less. From a viewpoint of improving a controllability of the supply amount, it is preferable that the capacity (volume) X0 is as small as possible. However, from the viewpoint of shortening a time of a replenishment process (improving a throughput), for example, the capacity X0 is preferably 1 cc or more.

Preferably, the discharge amount X2 is equal to or less than the amount of the liquid source (also referred to as a "process consumption amount C") to perform a film-forming process described later for a predetermined number of times (one batch). In other words, it is preferable that a volume of the discharge amount X2 is set to be equal to or less than a volume of the process consumption amount C. More preferably, the discharge amount X2 is equal to or less than ½ of the process consumption amount C. That is, it is preferable that an amount obtained by performing a supply of the liquid source from the liquid source storage 756 a plurality of times is equal to or greater than the process consumption amount C. In other words, it is preferable that a volume of the liquid source storage 756 is set to be greater than a volume of the discharge amount X2. Further, the fillable amount X1 and the discharge amount X2 may be set by measuring amounts filled and discharged, which are obtained by performing operations related thereto in advance in the apparatus (that is, the substrate processing apparatus 10), and by storing an average value and the like.

<Operations>

Subsequently, a method of manufacturing a semiconductor device using the substrate processing apparatus 10 will be described. In the following description, the operations of the components constituting the substrate processing apparatus 10 are controlled by the controller 121.

Figure 5:
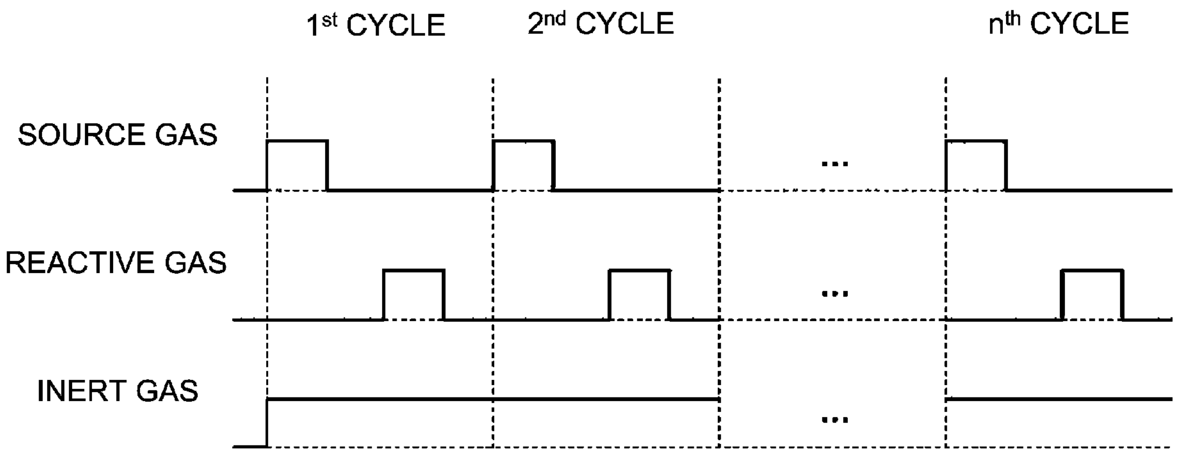
FIG. 5 is a diagram schematically illustrating a film-forming sequence when a film-forming process is performed on a wafer using the substrate processing apparatus according to the embodiments of the present disclosure.

First, an exemplary sequence of forming a film on the wafer 200 by using the substrate processing apparatus 10 will be described with reference to FIG. 5. In the present embodiments, the process chamber 201 in which the wafers 200 are accommodated in a stacked manner is heated to a predetermined temperature. Then, a source gas supply step of supplying the source gas containing a predetermined element into the process chamber 201 through the supply holes 410*a* of the nozzle 410 and a reactive gas supply step of supplying the reactive gas through the supply holes 420*a* of the nozzle 420 are performed a predetermined number of times (n times). As a result, a film containing the predetermined element is formed on the wafer 200. In the present embodiments, the predetermined number of times (n times) refers to one batch process in the film-forming process, and is set in advance. In the present embodiments, the predetermined number of times may also be referred to as a "pre-set number of times N".

Hereinafter, the method of manufacturing the semiconductor device will be described in detail.

<Stacking Step and Boat Loading Step>

First, the wafers 200 are stacked (transferred or charged) into the boat 217 (stacking step). Then, the shutter 219*s* is moved by the shutter opener/closer 115*s* to open the lower end opening of the manifold 209 (shutter opening step). Thereafter, as shown in FIG. 3, the boat 217 in which the wafers 200 are stacked is elevated by the boat elevator 115 and loaded (transferred) into the process chamber 201 (boat loading step). With the boat 217 loaded, the seal cap 219 airtightly seals the lower end of the manifold 209 via the O-ring 220*b*.

<Pressure Adjusting Step and Temperature Adjusting Step>

Thereafter, the vacuum pump 246 vacuum-exhausts (decompresses and exhausts) the inner atmosphere of the process chamber 201 such that the inner pressure of the process chamber 201 reaches and is maintained at a desired pressure (vacuum degree). When the vacuum pump 246 vacuum-exhausts the inner atmosphere of the process chamber 201, the inner pressure of the process chamber 201 is measured by the pressure sensor 245, and the APC valve 243 is feedback-controlled based on the pressure information detected by the pressure sensor 245 (pressure adjusting step). The vacuum pump 246 continuously vacuum-exhausts the inner atmosphere of the process chamber 201 until at least a processing of the wafer 200 is completed.

In addition, the heater 207 heats the process chamber 201 such that a temperature of the process chamber 201 reaches and is maintained at a desired temperature (temperature adjusting step). The heater 207 continuously heats the process chamber 201 until at least the processing of the wafer 200 is completed.

In addition, the rotator 267 rotates the boat 217 and the wafers 200 accommodated in the boat 217. The rotator 267 continuously rotates the boat 217 and the wafers 200 until at least the processing of the wafer 200 is completed.

<Step of Adjusting Amount of Liquid Source (Example of Storage Step)>

Subsequently, the liquid source is stored in the storage tank 610 such that the liquid surface level of the liquid source stored in the storage tank 610 shown in FIG. 1 reaches and is maintained at an initial liquid surface level L0 serving as a predetermined filling level. According to the present embodiments, the initial liquid surface level L0 may refer to a liquid surface level when a total sum of a minimum amount of the liquid source for the ultrasonic sensor 650 to detect the liquid surface level and an amount of the liquid source for performing the film-forming process described later the predetermined number of times (that is, the pre-set number of times N) is stored in the storage tank 610.

The minimum amount of the liquid source for the ultrasonic sensor 650 to detect the liquid surface level may refer to an amount of the liquid source in a case where the liquid surface level is located at the lower limit value of the storage tank 610.

In addition, the amount of the liquid source for performing the film-forming process the predetermined number of times (pre-set number of times N) may refer to an amount of the liquid source for forming the film on the wafers 200 by performing a cycle (in which the source gas supply step, a first residual gas removing step, the reactive gas supply step and a second residual gas removing step are sequentially performed in this order) described later a predetermined number of times (one or more times). The amount of the liquid source for forming the film on the wafers 200 may also be referred to as the "process consumption amount C".

For example, according to the present embodiments, the amount of the liquid source for performing the film-forming process the predetermined number of times (pre-set number of times N) can be obtained by detecting the amount of the liquid source actually consumed by using the ultrasonic sensor 650. However, the amount of the liquid source for performing the film-forming process the predetermined number of times may be set as a predetermined supply amount C1 in advance, for example, from an average value of the amount of the liquid source used (consumed) in the same batch process. In such a case, it is preferable that the capacity X0 of the liquid source storage 756 is equal to or less than the predetermined supply amount C1. In addition, it is preferable that the fillable amount X1 to the liquid source storage 756 and the discharge amount X2 discharged from liquid source storage 756 are equal to or less than the predetermined supply amount C1.

Hereinafter, a replenishment operation and an adjusting operation of the amount of the liquid source will be described in detail.

Figure 6:
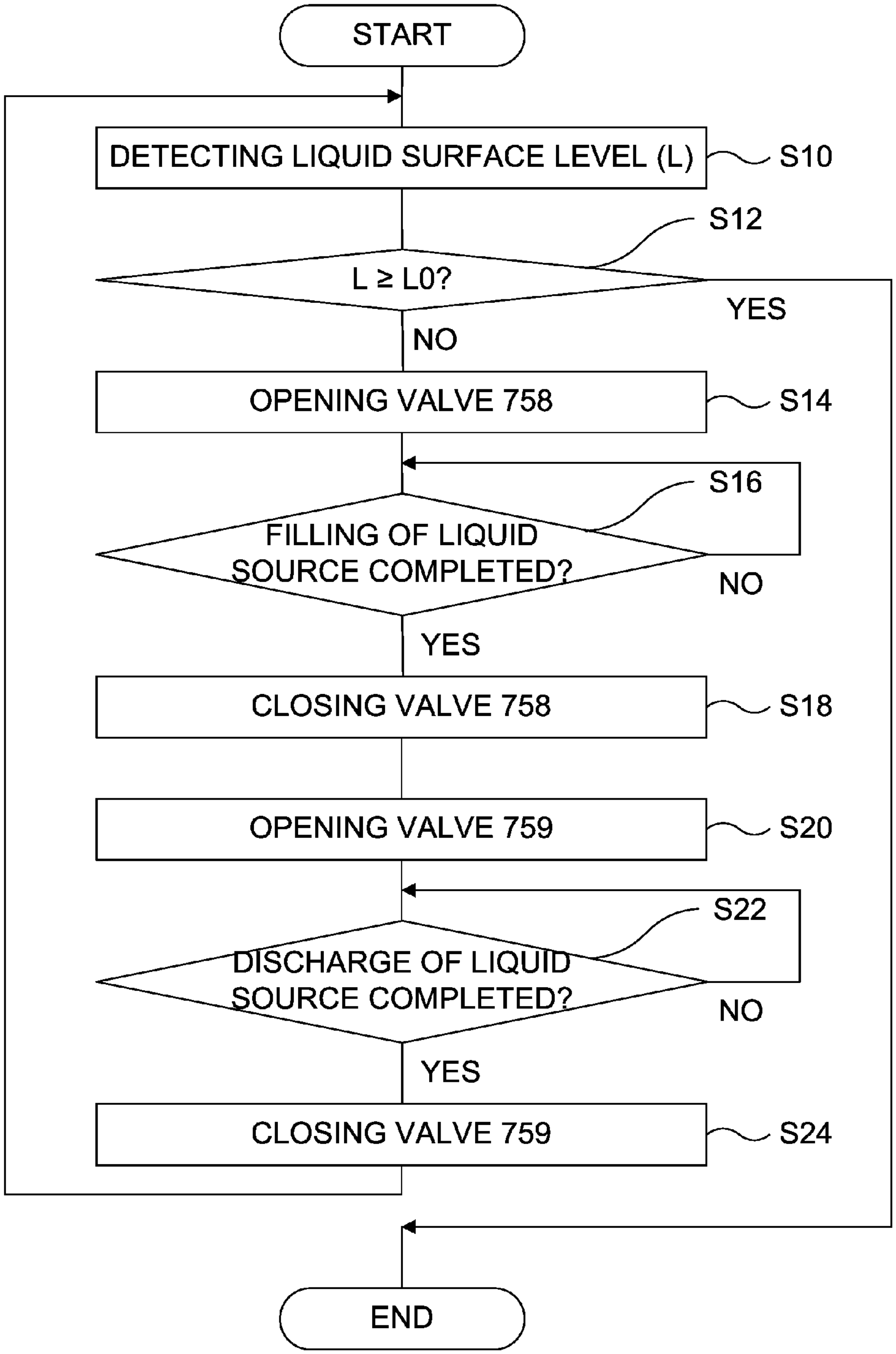
FIG. 6 is a flowchart schematically illustrating a liquid source replenishment process according to the embodiments of the present disclosure.

The controller 121 replenishes the storage tank 610 with the liquid source by the liquid source replenishment process shown in FIG. 6. First, in a step S10, the ultrasonic sensor 650 detects a liquid surface level L of the liquid source. In a step S12, it is determined whether or not the liquid surface level of the liquid source has reached the initial liquid surface level L0. In a case where the liquid surface level of the liquid source has reached the initial liquid surface level L0, the present process is terminated.

Figure 7A:
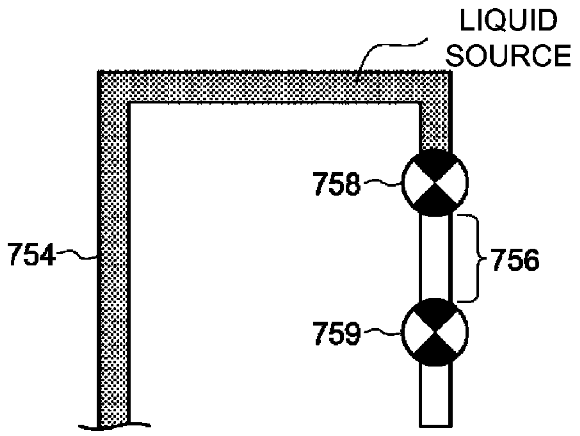
FIG. 7A is a diagram schematically illustrating a filling state of the liquid source before a valve 758 is opened in a step S14 of the liquid source replenishment process shown in FIG. 6.
Figure 7B:
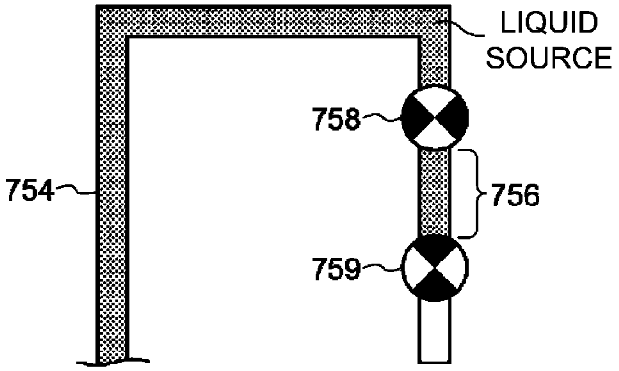
FIG. 7B is a diagram schematically illustrating a filling state of the liquid source after the valve 758 is opened in the step S14 and before a valve 759 is opened in a step S20 of the liquid source replenishment process shown in FIG. 6.

In a case where the liquid surface level of the liquid source has not reached the initial liquid surface level L0, the valve 758 is opened in a step S14. Before the valve 758 is opened, as shown in FIG. 7A, the liquid supply pipe 754 is filled with the liquid source up to an upstream side of the valve 758. When filling the liquid supply pipe 754 with the liquid source, the valve 759 is closed. As shown in FIG. 7B, by opening the valve 758, the liquid source storage 756 is filled with the liquid source by the pressure-feeding pressure from the replenishment tank 760 (filling step). In a step S16, the present process waits until the liquid source storage 756 is filled with the liquid source, and after the liquid source storage 756 is filled with the liquid source, the present process proceeds to a step S18. It is possible to determine whether or not a filling of the liquid source has been completed based on a lapse of a predetermined time from an opening of the valve 758 and the like.

The valve 758 is closed in the step S18 and the valve 759 is opened in a step S20. According to the present embodiments, between the steps S18 and S20, a state in which both of the valves 758 and 759 are closed is maintained for a predetermined time. By providing a timing in which both of the valves 758 and 759 are closed is maintained for the predetermined time in a manner described above, it is possible to prevent both of the valves 758 and 759 from being opened even when there is a difference in opening and closing timings of the valves 758 and 759. When both of the valves 758 and 759 are opened, the replenishment tank 760 is in communication with the storage tank 610. In such a case, a large amount of the liquid source flows into the storage tank 610. As a result, it is difficult to control the amount of the liquid source supplied into the storage tank 610. As described above, it is preferable to control the opening and closing timings of both of the valves 758 and 759 such that both of the valves 758 and 759 are closed before one of them is opened.

Figure 7C:
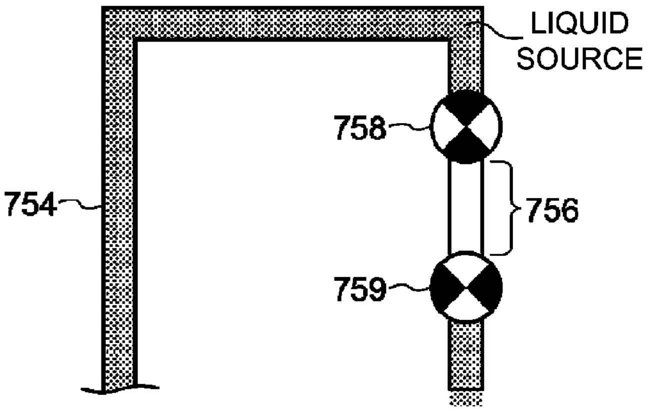
FIG. 7C is a diagram schematically illustrating a filling state of the liquid source after the valve 759 is opened in the step S20 of the liquid source replenishment process shown in FIG. 6.

By opening the valve 759, as shown in FIG. 7C, the liquid source is discharged from the liquid source storage 756 and is supplied to the storage tank 610 through an opening of the nozzle 754N (discharge step). By performing such an operation, the amount of the liquid source supplied to the storage tank 610 becomes the discharge amount X2. In a step S22, the present process waits until the liquid source is discharged from the liquid source storage 756, and after the liquid source is discharged, the process proceeds to a step S24. For example, it is possible to determine whether or not a discharge of the liquid source has been completed based on a lapse of a predetermined time from an opening of the valve 759 and the like. In the step S24, the valve 758 is closed and the process returns to the step S10 to repeatedly perform the filling and discharging process. The filling and discharging process is repeatedly perform until the liquid surface level L of the liquid source detected by the ultrasonic sensor 650 reaches the initial liquid surface level L0. Between the steps S24 and S14, both of the valves 758 and 759 are closed the same as between the steps S18 and S20.

<Film-forming Process (Example of Substrate Processing)>

<Vaporizing Step>

The liquid source stored in the storage tank 610 is vaporized into the source gas.

Specifically, an amount of the source gas for performing the source gas supply step described later is stored in advance in the controller 121. The controller 121 controls the MFC 706 of the vaporizer 700 so as to supply the inert gas serving as the carrier gas to the liquid source stored in the storage tank 610. Thereby, the liquid source is vaporized into the source gas.

For example, as the inert gas, nitrogen (N2) gas or a rare gas such as argon (Ar) gas, helium (He) gas, neon (Ne) gas and xenon (Xe) gas may be used. For example, one or more of the gases exemplified above as the inert gas may be used as the inert gas. The same also applies to the steps described below.

<Source Gas Supply Step (Example of Processing Step)>

Subsequently, the valve 314 shown in FIG. 3 is opened to supply the source gas into the gas supply pipe 310. As the source gas, one or more of gases (which are exemplified above as the source gas) obtained by vaporizing the liquid source in the vaporization vessel may be used.

As the source gas, for example, a gas containing a predetermined element and in a liquid state at the normal temperature and the normal pressure (that is, the liquid source) may be used. As the predetermined element, for example, a semiconductor element such as silicon (Si) or a metal element such as titanium (Ti), zirconium (Zr), hafnium (Hf), tantalum (Ta), aluminum (Al), molybdenum (Mo) and tungsten (W) may be used. It is possible to obtain the source gas by vaporizing the liquid source of the gas containing the predetermined element in the vaporization vessel.

As the liquid source of the source gas, for example, a silicon-containing liquid source of an aminosilane source gas such as tetrakis (dimethylamino) silane (Si[N(CH3)2]4, abbreviated as 4DMAS) gas, tris (dimethylamino) silane (Si[N(CH3)2]3H, abbreviated as 3DMAS) gas, bis (diethylamino) silane (Si[N(C2H5)2]2H2, abbreviated as BDEAS) gas and bis (tertiarybutylamino) silane (SiH2[NH (C4H9)]2, abbreviated as BTBAS) gas may be used. As the liquid source of the source gas, for example, a liquid source of a halosilane source gas such as monochlorosilane (SiH3C1, abbreviated as MCS) gas, dichlorosilane (SiH2C12, abbreviated as DCS) gas, trichlorosilane (SiHC13, abbreviated as TCS) gas, tetrachlorosilane (SiC14, abbreviated as STC) gas, hexachlorodisilane (Si2C16, abbreviated as HCDS) gas, octachlorotrisilane (Si3C18, abbreviated as OCTS) gas, 1,2-bis (trichlorosilyl) ethane ((SiC13)2C2H4, abbreviated as BTCSE) gas, bis (trichlorosilyl) methane ((SiC13)2CH2, abbreviated as BTCSM) gas, 1,1,2,2-tetrachloro-1,2-dimethyldisilane ((CH3) 2Si2C14, abbreviated as TCDMDS) gas, 1,2-dichloro-1,1, 2,2-tetramethyldisilane ((CH3)4Si2C12, abbreviated as DCTMDS) gas, 1-monochloro-1,1,2,2,2-pentamethyldisilane ((CH3)5Si2C1, abbreviated as MCPMDS) gas, trifluorosilane (SiHF3, abbreviated as TFS) gas, tetrafluorosilane (SiF4, abbreviated as STF) gas, tribromosilane (SiHBr3, abbreviated as TBS) gas, tetrabromosilane ((SiBr4, abbreviated as STB) gas may be used. As the liquid source of the source gas, for example, a liquid source of an inorganic silane source gas such as trisilane (Si3H8) gas, tetrasilane (Si4H10) gas, pentasilane (Si5H12) gas and hexasilane (Si6H14) gas or a liquid source of an organic silane source gas such as 1,4-disilabutane (Si2C2H10) gas may be used.

As the liquid source of the source gas, for example, a liquid source of a titanium-containing source gas such as tetrakis (dimethylamino) titanium (Ti[N(CH3)2]4, abbreviated as TDMAT) gas and titanium tetrachloride (TiCl4) gas or a liquid source of a hafnium-containing source gas such as tetrakis (ethylmethylamino) hafnium (Hf[N(C2H5) (CH3)]4, abbreviated as TEMAH) gas and hafnium tetrachloride (HfC14) gas may be used. As the liquid source of the source gas, for example, a liquid source of a zirconium-containing source gas such as tetrakis (ethylmethylamino) zirconium (Zr[N(C2H5)(CH3)]4, abbreviated as TEMAZ) gas, a liquid source of an aluminum-containing source gas such as trimethylaluminum (Al(CH3)3, abbreviated as TMA) gas, or a liquid source of a tantalum-containing source gas such as tetraethoxytantalum (Ta(OC2H5)5), tris (ethylmethylamino tert-butylimino) tantalum (Ta[NC(CH3)$_3$][N(C2H5)CH3]3) and pentaethoxy tantalum (Ta(OC2H5) 5) gas may be used. In particular, as the liquid source of the source gas, it is more preferable to use a liquid source whose vapor pressure is low with respect to the impurities contained in the liquid source, because it becomes easier to obtain an effect of reducing the impurities according to the technique of the present disclosure.

The source gas whose flow rate is adjusted by the MFC 312 is supplied into the process chamber 201 through the supply holes 410*a* of the nozzle 410. In the present step, simultaneously with a supply of the source gas, the valve 514 is opened to supply the carrier gas into the gas supply pipe 510. The carrier gas whose flow rate is adjusted by the MFC 512 is supplied into the process chamber 201 together with the source gas through the supply holes 410*a* of the nozzle 410, and is exhausted through the exhaust pipe 231.

In the present step, in order to prevent the source gas from entering the nozzle 420 (that is, in order to prevent a back flow of the source gas), the valve 524 may be opened to supply the carrier gas into the gas supply pipe 520. The carrier gas is then supplied into the process chamber 201 through the gas supply pipe 520 and the nozzle 420, and is exhausted through the exhaust pipe 231.

In the present step, for example, the APC valve 243 is appropriately adjusted (or controlled) such that the inner pressure of the process chamber 201 is set to a pressure within a range from 1 Pa to 1,000 Pa. In the present specification, a notation of a numerical range such as "from 1 Pa to 1,000 Pa" means that a lower limit and an upper limit are included in the numerical range. Therefore, for example, the numerical range "from 1 Pa to 1,000 Pa" means a range equal to or higher than 1 Pa and equal to or lower than 1,000 Pa. The same also applies to other numerical ranges described in the present specification.

For example, a supply flow rate of the source gas controlled by the MFC 312 is set to a flow rate within a range from 10 sccm to 2,000 sccm, preferably from 50 sccm to 1,000 sccm, and more preferably from 100 sccm to 500 sccm.

For example, a supply time (which is a time duration) of supplying the source gas to the wafer 200 is set to a time duration within a range from 1 second to 60 seconds.

For example, the heater 207 heats the wafer 200 such that a temperature of the wafer 200 reaches and is maintained at a temperature within a range from 400 °C to 600 °C When the source gas is supplied to the process chamber 201 under the conditions described above, it is possible to form a layer containing the predetermined element contained in the source gas on an uppermost surface (outermost surface) of the wafer 200.

First Residual Gas Removing Step (Example of Processing Step)

After the layer containing the predetermined element is formed, the valve 314 is closed to stop the supply of the source gas. In the present step, with the APC valve 243 open, the vacuum pump 246 vacuum-exhausts the inner atmosphere of the process chamber 201 to remove a residual gas remaining in the process chamber 201 such as a residual source gas which did not react or which contributed to a formation of the layer containing the predetermined element from the process chamber 201. In the present step, by maintaining the valves 514 and 524 open, the carrier gas is continuously supplied into the process chamber 201. The carrier gas serves as a purge gas, which improves an efficiency of removing the residual gas remaining in the process chamber 201 such as the residual source gas which did not react or which contributed to the formation of the layer containing the predetermined element from the process chamber 201.

Reactive Gas Removing Step (Example of Processing Step)

After the residual gas remaining in the process chamber 201 is removed, the valve 324 is opened to supply the reactive gas into the gas supply pipe 320. As the reactive gas, for example, a gas containing an element such as oxygen (O) reacting with the predetermined element contained in the source gas may be used. That is, an oxygen-containing gas (which is an oxidizing gas or an oxidizing agent) serving as a reactant may be used as the reactive gas. As the oxygen-containing gas, for example, a gas such as oxygen (O2) gas, ozone (O3) gas, plasma-excited O2 gas (O2*gas), a mixed gas of the O2 gas and hydrogen (H2) gas, water vapor (H2O) gas, hydrogen peroxide ($H_2O_2$) gas, nitrous oxide (N2O) gas, nitrogen monoxide (NO) gas, nitrogen dioxide (NO2) gas, carbon monoxide (CO) gas and carbon dioxide (CO2) gas may be used. For example, one or more of the gases exemplified above as the reactive gas may be used as the reactive gas.

The reactive gas whose flow rate is adjusted by the MFC 322 is supplied to the wafers 200 in the process chamber 201 through the supply holes 420*a* of the nozzle 420, and is exhausted through the exhaust pipe 231. That is, the wafer 200 is exposed to the reactive gas.

In the present step, the valve 524 is opened to supply the carrier gas into the gas supply pipe 520. The carrier gas whose flow rate is adjusted by the MFC 522 is supplied into the process chamber 201 together with the reactive gas, and is exhausted through the exhaust pipe 231, and is exhausted through the exhaust pipe 231. In the present step, in order to prevent the reactive gas from entering the nozzle 410 (that is, in order to prevent a back flow of the reactive gas), the valve 514 may be opened to supply the carrier gas into the gas supply pipe 510. The carrier gas is then supplied into the process chamber 201 through the gas supply pipe 510 and the nozzle 410, and is exhausted through the exhaust pipe 231.

In the present step, for example, the APC valve 243 is appropriately adjusted (or controlled) such that the inner pressure of the process chamber 201 is set to a pressure within a range from 1 Pa to 1,000 Pa. For example, a supply flow rate of the reactive gas controlled by the MFC 322 is set to a flow rate within a range from 5 slm to 40 slm, preferably from 5 slm to 30 slm, and more preferably from 10 slm to 20 slm. For example, a supply time (which is a time duration) of supplying the reactive gas to the wafer 200 is set to a time duration within a range from 1 second to 60 seconds. Other process conditions of the present step may be set to be the same as those in the source gas supply step described above.

In the present step, the reactive gas and the inert gas (that is, the carrier gas) are supplied into the process chamber 201 without any other gas being supplied into the process chamber 201 together with the reactive gas and the inert gas. In a case where the oxygen-containing gas serving as the reactive gas is supplied into the process chamber 201 under the process conditions described above, the reactive gas reacts with at least a portion of the layer containing the predetermined element which is formed on the wafer 200 in the source gas supply step. Thereby, the layer containing the predetermined element is oxidized to form an oxide layer containing the predetermined element and oxygen. That is, the layer containing the predetermined element is modified into the oxide layer containing the predetermined element.

<Second Residual Gas Removing Step (Example of Processing Step)>

After the oxide layer containing the predetermined element is formed, the valve 324 is closed to stop the supply of the reactive gas. In the present step, a residual gas remaining in the process chamber 201 such as the reactive gas in the process chamber 201 which did not react or which did contribute to a formation of the oxide layer and reaction by-products can be removed from the process chamber 201 in the same manners as in the first residual gas removing step performed after the source gas supply step.

The cycle (in which the vaporizing step, the source gas supply step, the first residual gas removing step, the reactive gas supply step and the second residual gas removing step described above are sequentially performed in this order) is performed a predetermined number of times (one or more times). That is, by performing a batch process (in which a plurality of steps are performed a plurality number of times), it is possible to form an oxide film obtained by stacking (laminating) the oxide layer on the wafer 200.

In the present embodiments, the "batch process" refers to a process of forming a film of a predetermined thickness on the wafer 200 by performing the cycle (in which the vaporizing step, the source gas supply step, the first residual gas removing step, the reactive gas supply step and the second residual gas removing step described above are sequentially performed in this order) the predetermined number of times. The film of the predetermined thickness is formed on the wafer 200 in one batch.

For example, the predetermined thickness is set to be a thickness within a range from 10 nm to 150 nm, preferably from 40 nm to 100 nm, and more preferably from 60 nm to 80 nm.

<Replenishment Step>

As described above, the film of the predetermined thickness is formed on the wafer 200 by subjecting the wafer 200 to the batch process. Since the liquid source stored in the storage tank 610 is consumed by the process consumption amount C, the liquid surface level of the liquid source in the storage tank 610 is lower than the initial liquid surface level L0.

Therefore, the controller 121 performs the liquid source replenishment process shown in FIG. 6 to replenish the liquid source such that the liquid surface level L of the liquid source reaches the initial liquid surface level L0 (replenishment step). The liquid source is replenished by performing the liquid source replenishment process for each batch process. That is, the liquid source replenishment process is performed until the liquid surface level L (which has decreased by the process consumption amount C) reaches the initial liquid surface level L0. Therefore, the filling and discharging process in the liquid source replenishment process is repeatedly performed until the amount of the liquid source supplied to the storage tank 610 is equal to or greater than the process consumption amount C. However, in a case where the liquid surface level L of the liquid source before the batch process is started is higher than the initial liquid surface level L0, the liquid surface level L may reach the initial liquid surface level L0 when the filling and discharging process is performed until an amount of the liquid source that is less than the process consumption amount C by one cycle is supplied in a subsequent liquid source replenishment process.

<After-purge Step and Returning to Atmospheric Pressure Step>

After the film of the predetermined thickness is formed on the wafer 200 and the second residual gas removing step is completed, the valves 514 and 524 shown in FIG. 3 are opened to supply the carrier gas into the process chamber 201 through each of the gas supply pipes 310 and 320, and then is exhausted through the exhaust pipe 231. The carrier gas serves as the purge gas. Thereby, the residual gas in the process chamber 201 and by-products remaining in the process chamber 201 are removed from the process chamber 201 (after-purge step). Thereafter, the inner atmosphere of the process chamber 201 is replaced with the carrier gas, and the inner pressure of the process chamber 201 is returned to the normal pressure (atmospheric pressure) (returning to atmospheric pressure step).

<Boat Unloading Step and Wafer Discharging Step>

Thereafter, the seal cap 219 is lowered by the boat elevator 115 and the lower end of the manifold 209 is opened. Then, the boat 217 with the processed wafers 200 supported therein is unloaded (transferred) out of the process tube 203 through the lower end of the manifold 209 (boat unloading step).

After the boat 217 is unloaded, the shutter **219*s* is moved such that the lower end opening of the manifold 209 is sealed by the shutter 219*s* through the O-ring 220*c* (shutter closing step). After the boat 217 is unloaded (transferred) out of the process tube 203, the processed wafers 200 are discharged (transferred) from the boat 217** (wafer discharging step).

As described above, the wafers 200 on which the film of the predetermined thickness is formed through each process (process) are discharged. Thereafter, in a case of forming the film on another wafers 200, except for "Step of Adjusting Amount of Liquid Source", the steps "Stacking Step and Boat Loading Step", "Pressure Adjusting Step and Temperature Adjusting Step", "Film-forming Process", "After-purge Step and Returning to Atmospheric Pressure Step" and "Boat Unloading Step and Wafer Discharging Step" described above are performed again. In other words, the batch process of the wafers 200 is performed again.

It is possible to form the oxide film containing the predetermined element contained in the source gas on the wafers 200 by the film-forming process described above. For example, by using the source gas described above, it is possible to form the oxide film such as a titanium oxide film (TiO film), a zirconium oxide film (ZrO film), a hafnium oxide film (HfO film), a tantalum oxide film (TaO film), an aluminum oxide film (AlO film), a molybdenum oxide film (MoO film) and a tungsten oxide film (WO film). For example, instead of the oxygen-containing gas, by using a nitrogen-containing gas (which is a nitriding gas or a nitriding agent) as the source gas, it is possible to form a nitride film such as a titanium nitride film (TiN film), a zirconium nitride film (ZrN film), a hafnium nitride film (HfN film), a tantalum nitride film (TaN film), an aluminum nitride film (AlN film), a molybdenum nitride film (MoN film) and tungsten nitride film (WN film).

<Other Steps>

Thereafter, it is possible to manufacture the semiconductor device by performing known steps such as a pattern forming step, a dicing step, a wire bonding step, a molding step and a trimming step to the wafers 200 on which the film is formed.

SUMMARY

As described above, by controlling the replenishment structure 750 as described above and supplying the liquid source pressure-fed (pumped) from the replenishment tank 760 to the storage tank 610, it is possible to control the supply amount of the liquid source such that a predetermined amount of the liquid source is accurately supplied to the storage tank 610.

Specifically, according to the embodiments described above, the liquid source is replenished by controlling the opening and closing operations of the valves 758 and 759 to temporarily store the liquid source in the liquid source storage 756 and to discharge the liquid source to the storage tank 610. In particular, in a case where the amount of the liquid source to be replenished is small, when the liquid source is supplied by an opening and closing operation of a single valve alone, the supply amount of the liquid source may vary due to reasons such as a fluctuation in an inner pressure of the liquid supply pipe 754 and an accuracy of timing control of the opening and closing operation of the single valve alone. However, according to the embodiments described above, it is possible to accurately supply a constant amount of the liquid source even when the amount of the liquid source to be replenished is small.

For example, it is conceivable to use an MFC (mass flow controller) in order to accurately supply a small amount of the liquid source. However, in such a case, since the inner pressure of the liquid supply pipe 754 may fluctuate due to reasons such as a fluctuation in the inner pressure of the storage tank 610 and a fluctuation in the pressure-feeding pressure from the replenishment tank 760, it is difficult to accurately perform an operation of supplying the small amount of the liquid source. In addition, a cost increases accordingly. According to the embodiments described above, even when the inner pressure of the liquid supply pipe 754 fluctuates, it is possible to supply an accurate amount of the liquid source, and it is also useful in terms of a cost reduction.

For example, each time the wafers 200 are subjected to the batch process, the liquid source is replenished in the storage tank 610 by the replenishment structure 750 (every batch refilling). As a result, the amount of the liquid source stored in the storage tank 610 falls within a predetermined range. In other words, by replenishing the liquid source by an amount that is reduced, it is possible to constantly maintain the amount of the liquid source stored in the storage tank 610 (that is, it is possible to constantly maintain the liquid surface level) when the film-forming process is performed on the wafers 200. As a result, by suppressing a variation in the concentration of the impurities contained in the source gas, it is possible to suppress a variation in a uniformity of the film (which is formed on the wafer 200) on the surface of the wafer 200.

For example, according to the embodiments described above, the initial liquid surface level L0 refers to the liquid surface level when the total sum of the minimum amount of the liquid source for the ultrasonic sensor 650 to detect the liquid surface level and the amount of the liquid source for performing the film-forming process the predetermined number of times (that is, for forming the oxide film on the wafer 200) is stored in the storage tank 610. In other words, the liquid surface level is maintained at a lowest allowable position such that an absolute amount of the impurities contained in the liquid source stored in the storage tank 610 becomes as small as possible. Further, even when the amount of the liquid source used in one batch may vary, the liquid source is replenished (refilled) by the amount that is reduced such that the liquid surface level after replenishing the liquid source is maintained constant at all times. Therefore, as compared with a case where the initial liquid surface level L0 is located at, for example, the upper limit set value of the storage tank 610, the concentration of the impurities contained in the source gas is small. As a result, it is possible to improve the uniformity of the film on the surface of the wafer 200.

Other Embodiments of Present Disclosure

While the technique of the present disclosure is described in detail by way of the embodiments described above, the technique of the present disclosure is not limited thereto. It will be apparent to those skilled in the art that the technique of the present disclosure may be modified in various ways without departing from the scope thereof. For example, the embodiments described above are described by way of an example in which the liquid source is vaporized into the source gas by using the bubbling method. However, for example, the liquid source may be vaporized into the source gas by using another method such as a baking method and a direct vaporization method.

For example, the embodiments described above are described by way of an example in which the liquid source replenishment process is repeatedly performed until the liquid surface level L of the liquid source detected by the ultrasonic sensor 650 reaches the initial liquid surface level L0. However, for example, the liquid source replenishment process may be performed without detecting the liquid surface level L. In such a case, the amount of the liquid source for the batch process is set in advance as the predetermined supply amount C1, and considering the amount of the liquid source supplied by performing one cycle of the liquid source replenishment process (that is, the discharge amount X2), a predetermined number of times of repeatedly performing the liquid source replenishment process for supplying the predetermined supply amount C1 is calculated in advance. Then, according to a flow shown in FIG. 8, the liquid source replenishment process is performed. In the liquid source replenishment process shown in FIG. 8, by performing the liquid source replenishment process the predetermined number of times, it is possible to replenish the amount of the liquid source for the batch process.

Figure 8:
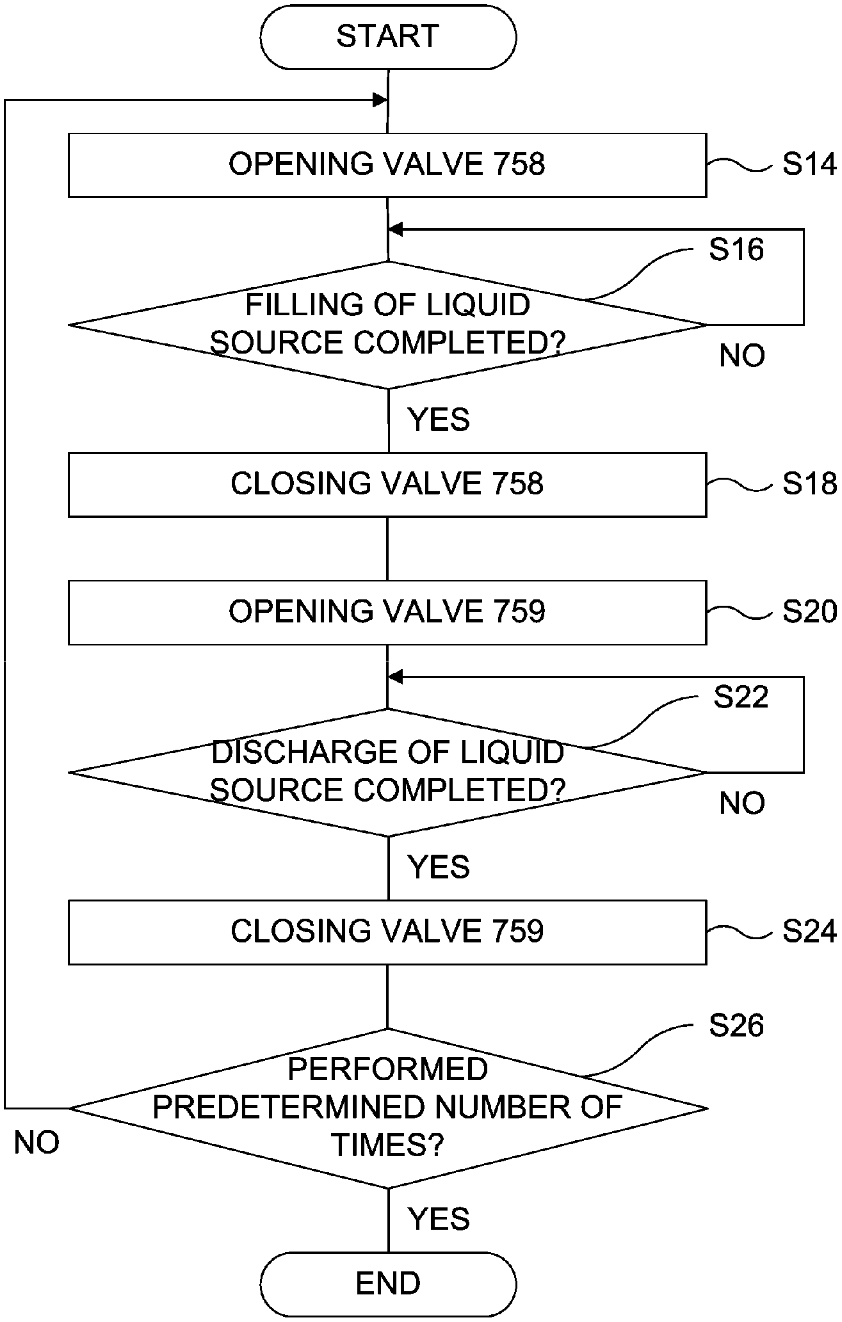
FIG. 8 is a flowchart schematically illustrating a liquid source replenishment process according to other embodiments of the present disclosure.

In the liquid source replenishment process shown in FIG. 8, the valve 758 is opened in the step S14. By opening the valve 758, the liquid source storage 756 is filled with the liquid source. In the step S16, the present process waits until the liquid source storage 756 is filled with the liquid source. After the liquid source storage 756 is filled with the liquid source, the valve 758 is closed in the step S18, and the valve 759 is opened in the step S20. By opening the valve 759, the liquid source is discharged (ejected) from the liquid source storage 756, and the liquid source is supplied to the storage tank 610 through the opening of the nozzle 754N. By performing such an operation, the amount of the liquid source supplied to the storage tank 610 becomes the discharge amount X2. In the step S22, the present process waits until the liquid source is discharged from the liquid source storage 756, and after the liquid source is discharged, the valve 759 is closed in the step S24. Then, in a step S26, it is determined whether or not a cycle including the steps S14 through S24 is performed a predetermined number of times. When it is determined that the cycle of the present process is not performed the predetermined number of times in the step S26, the present process returns to the step S14 to perform the cycle of the present process again, and when it is determined that the cycle of the present process is performed the predetermined number of times in the step S26, the present process is terminated. By setting the predetermined supply amount C1 in advance in a manner described above, it is possible to accurately replenish the liquid source even when the liquid surface level sensor such as the ultrasonic sensor 650 fails.

Figure 9:
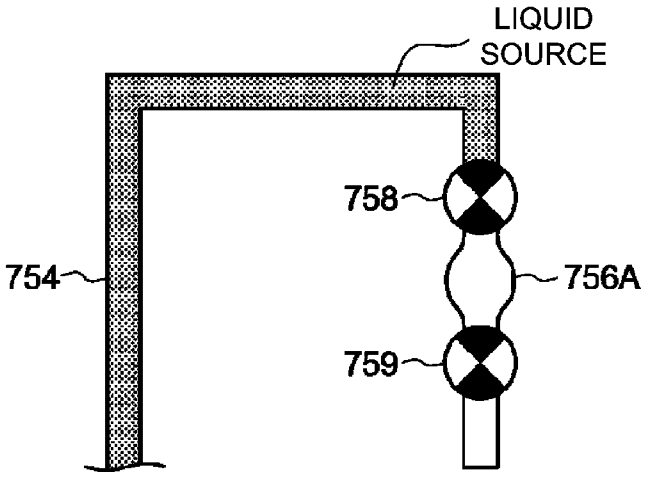
FIG. 9 is a diagram schematically illustrating a liquid source storage according to a modified example of the embodiments of the present disclosure.

For example, the embodiments described above are described by way of an example in which the liquid source storage 756 in which the liquid source is stored is defined by the portion of the liquid supply pipe 754 between the valves 758 and 759. However, for example, as shown in FIG. 9, instead of the liquid source storage 756, a liquid source storage 756A whose capacity is greater than that of the liquid supply pipe 754 may be provided between the valves 758 and 759. For example, the liquid source storage 756A may be implemented by a pipe whose piping diameter is greater than that of other portions, or may be implemented by a buffer tank.

For example, the embodiments described above are described by way of an example in which the liquid source is vaporized in the storage tank 610 by using the bubbling method. However, a heater may be provided to heat the liquid source stored in the storage tank 610, and the liquid source may be vaporized by using the heater.

According to some embodiments in the present disclosure, it is possible to control the supply amount of the liquid source so as to accurately supply the predetermined amount of the liquid source into the vaporization vessel when replenishing the vaporization vessel with the liquid source.

What is claimed is:

1. A substrate processing apparatus comprising:

a vaporization vessel;

a liquid source replenishment line whose first end is connected to the vaporization vessel and whose second end is connected to a supply source of a liquid source;

a first valve provided at the liquid source replenishment line;

a second valve provided at the liquid source replenishment line and upstream of the first valve;

a liquid source storage provided between the first valve and the second valve;

a process chamber in which a substrate is processed;

a process gas supply pipe connecting the process chamber and the vaporization vessel and through which a process gas obtained by vaporizing the liquid source in the vaporization vessel is introduced into the process chamber; and a controller configured to control opening and closing operations of the first valve and the second valve so as to supply the liquid source into the vaporization vessel by performing a filling and discharging process comprising:

(a) filling the liquid source storage with the liquid source by opening the second valve while the first valve is closed; and (b) closing the second valve after (a) and discharging the liquid source filled in the liquid source storage into the vaporization vessel by opening the first valve so as to perform the filling and discharging process whenever a process using the process gas is performed on the substrate in the process chamber a pre-set number of times, wherein an amount of the liquid source discharged into the vaporization vessel by performing one execution of the filling and discharging process is set to be equal to or less than a process consumption amount of the liquid source consumed by performing the process using the process gas on the substrate the pre-set number of times.

2. The substrate processing apparatus of claim 1, wherein the controller is further configured to control the first valve and the second valve so as to repeatedly perform the filling and discharging process until an amount of the liquid source supplied into the vaporization vessel reaches a process consumption amount of the liquid source consumed by performing the process using the process gas on the substrate the pre-set number of times.

3. The substrate processing apparatus of claim 1, wherein a volume of the liquid source storage is set to be equal to or less than a volume of a process consumption amount of the liquid source consumed by performing the process using the process gas on the substrate the pre-set number of times.

4. The substrate processing apparatus of claim 1, wherein a volume of the liquid source storage is set to be greater than a volume of the liquid source discharged into the vaporization vessel by performing one execution of the filling and discharging process.

5. The substrate processing apparatus of claim 1, wherein a delivery pressure of the liquid source delivered from the supply source to the liquid source replenishment line is set to be higher than an inner pressure of the vaporization vessel.

6. The substrate processing apparatus of claim 5, wherein the delivery pressure is set to be ten times or more of the inner pressure of the vaporization vessel.

7. The substrate processing apparatus of claim 1, further comprising:

a liquid surface level sensor configured to measure a liquid surface level of the liquid source in the vaporization vessel, wherein the controller is further configured to control the first valve and the second valve so as to perform the filling and discharging process a predetermined number of times until a liquid surface level of the liquid source measured by the liquid surface level sensor reaches a predetermined filling level.

8. The substrate processing apparatus of claim 7, wherein the controller is further configured to control the first valve and the second valve so as to stop the filling and discharging process when the liquid surface level of the liquid source measured by the liquid surface level sensor reaches the predetermined filling level.

9. The substrate processing apparatus of claim 1, wherein the controller is further configured to control the first valve and the second valve so as to perform the filling and discharging process a predetermined number of times until an amount of the liquid source supplied into the vaporization vessel reaches a predetermined supply amount set in advance.

10. The substrate processing apparatus of claim 9, wherein a volume of the liquid source storage is set to be less than a volume of the liquid source of the predetermined supply amount.

11. The substrate processing apparatus of claim 1, further comprising:

a liquid source supply nozzle provided in the vaporization vessel, wherein an upstream end of the liquid source supply nozzle is connected to the liquid source replenishment line, wherein the liquid source supply nozzle is arranged such that a discharge port thereof is located above a liquid surface of the liquid source stored in the vaporization vessel.

12. The substrate processing apparatus of claim 1, wherein the first valve and the second valve are provided above the vaporization vessel in a vertical direction.

13. The substrate processing apparatus of claim 1, wherein the controller is further configured to control the first valve and the second valve so as to perform the filling and discharging process such that both of the first valve and the second valve are closed before one of the first valve and the second valve is opened.

14. The substrate processing apparatus of claim 1, wherein a volume of the liquid source storage is set to be less than a volume of the vaporization vessel.

15. A liquid source replenishment system comprising:

a liquid source replenishment line whose first end is connected to a vaporization vessel and whose second end is connected to a supply source of a liquid source;

a first valve provided at a liquid source replenishment line;

a second valve provided at the liquid source replenishment line and upstream of the first valve;

a liquid source storage provided between the first valve and the second valve;

a process chamber in which a substrate is processed;

a process gas supply pipe connecting the process chamber and the vaporization vessel and through which a process gas obtained by vaporizing the liquid source in the vaporization vessel is introduced into the process chamber; and a controller configured to control opening and closing operations of the first valve and the second valve so as to supply the liquid source into the vaporization vessel by performing a filling and discharging process comprising:

(a) filling the liquid source storage with the liquid source by opening the second valve while the first valve is closed; and (b) closing the second valve after (a) and discharging the liquid source filled in the liquid source storage into the vaporization vessel by opening the first valve so as to perform the filling and discharging process whenever a process using the process gas is performed on the substrate in the process chamber a pre-set number of times, wherein an amount of the liquid source discharged into the vaporization vessel by performing one execution of the filling and discharging process is set to be equal to or less than a process consumption amount of the liquid source consumed by performing the process using the process gas on the substrate the pre-set number of times.

16. A substrate processing method by using a substrate processing apparatus comprising: a vaporization vessel; a liquid source replenishment line whose first end is connected to the vaporization vessel and whose second end is connected to a supply source of a liquid source; a first valve provided at the liquid source replenishment line; a second valve provided at the liquid source replenishment line and upstream of the first valve; a liquid source storage provided between the first valve and the second valve; a process chamber in which a substrate is processed; and a process gas supply pipe connecting the process chamber and the vaporization vessel and through which a process gas obtained by vaporizing the liquid source in the vaporization vessel is introduced into the process chamber, wherein the substrate processing method comprises:

supplying the liquid source into the vaporization vessel by performing:

(a) filling the liquid source storage with the liquid source by opening the second valve while the first valve is closed; and (b) closing the second valve after (a) and discharging the liquid source filled in the liquid source storage into the vaporization vessel by opening the first valve so as to perform (a) and (b) whenever a process using the process gas is performed on the substrate in the process chamber a pre-set number of times, wherein an amount of the liquid source discharged into the vaporization vessel by performing one execution of (a) and (b) is set to be equal to or less than a process consumption amount of the liquid source consumed by performing the process using the process gas on the substrate the pre-set number of times.

17. A method of manufacturing a semiconductor device, comprising the substrate processing method of claim 16.

18. A non-transitory computer-readable recording medium storing a program that causes, by a computer, the substrate processing apparatus to perform a process comprising the substrate processing method of claim 16.

* * * * *